United States Patent
Economikos et al.

(10) Patent No.: US 6,444,919 B1
(45) Date of Patent: Sep. 3, 2002

(54) THIN FILM WIRING SCHEME UTILIZING INTER-CHIP SITE SURFACE WIRING

(75) Inventors: Laertis Economikos, Wappingers Falls; Mukta Shaji Farooq, Hopewell Junction; Michael Ford McAllister, Clintondale; Eric Daniel Perfecto, Poughkeepsie; Chandrika Prasad, Wappingers Falls, all of NY (US); Keshav Prasad, San Jose, CA (US); Madhavan Swaminathan, Marietta, GA (US); Thomas Anthony Wassick, Wappingers Falls, NY (US); George White, Hoffman Estates, IL (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/477,054

(22) Filed: Jun. 7, 1995

(51) Int. Cl.$^7$ .............................. H05K 1/03; H01R 9/09
(52) U.S. Cl. ........................ 174/255; 174/262; 174/261
(58) Field of Search ................................ 174/255, 262, 174/264, 250, 261; 361/805, 792, 794, 795, 777, 778, 806; 439/44, 48, 74; 257/209, 665, 786

(56) References Cited

U.S. PATENT DOCUMENTS

| | | | | |
|---|---|---|---|---|
| 3,371,250 A | * | 2/1968 | Ross et al. | 174/261 |
| 4,254,445 A | | 3/1981 | Ho | 361/392 |
| 4,489,364 A | | 12/1984 | Chance et al. | 361/395 |
| 5,220,490 A | | 6/1993 | Weigler et al. | 361/409 |
| 5,224,022 A | | 6/1993 | Weigler et al. | 361/409 |
| 5,243,140 A | | 9/1993 | Bhatia et al. | 174/254 |
| 5,294,754 A | * | 3/1994 | Wu | 174/255 |
| 5,360,948 A | * | 11/1994 | Thornberg | 174/255 X |
| 5,496,971 A | * | 3/1996 | Moriizumi et al. | 174/255 |
| 5,536,908 A | * | 7/1996 | Etchells et al. | 174/262 X |
| 5,544,018 A | * | 8/1996 | Sommerfeldt et al. | 361/792 |

\* cited by examiner

Primary Examiner—Kamand Cuneo
(74) Attorney, Agent, or Firm—Ira D. Blecker

(57) ABSTRACT

A thin film wiring scheme on a substrate. The thin film wiring scheme includes a plurality of chip connection pads at each of a first and second chip site on the substrate, a plurality of directional wiring lines interspersed between the chip connection pads at each of the first and second chip sites, at least one of the directional wiring lines being orthogonal to at least one of the other directional wiring lines at each of the first and second chip sites, and a plurality of chip site interconnection lines connecting directional wiring lines at the first chip site with the directional wiring lines at the second chip site.

21 Claims, 5 Drawing Sheets

THIN FILM WIRING SCHEME UTILIZING INTER-CHIP SITE SURFACE WIRING

BACKGROUND OF THE INVENTION

The present invention generally relates to wiring systems for multi-chip modules and, more particularly, to wiring systems which facilitate repair and engineering changes in multi-chip modules fabricated from a plurality of layers, such as multi-layer ceramic modules and module wiring formed by thin film techniques.

A demand for increased complexity of electronic systems including integrated circuit chips has caused the development of the multi-chip module (MCM) which includes a plurality of integrated circuit chips.

Such MCMs usually take the form of relatively large, multi-layer constructions having a surface on which a plurality of chips may be mounted. Wiring can be run in a direction parallel to the surface at the interface between any two layers. Wiring can also be run perpendicular to the surface and between wiring layers with through-holes or vias in the layers which are filled with conductive material. MCMs have been implemented with a variety of technologies including multi-layered co-fired ceramics, silicon based thin film structures, ceramic based thin film structures and combinations of those techniques.

However, because of the multi-layer construction, there is no access to wiring other than on the surface of the multi-layer structure. Therefore, engineering changes or wiring repairs cannot readily be made.

Since such structures are complex and require a number of processing steps for each layer, substantial expense is involved in the fabrication of the multi-layer structure. It is therefore economically important that engineering changes be possible and that the multi-layer structure be repairable. In the past, engineering changes and/or repairs have been accomplished by providing one or more layers of redistribution wiring from the chip input/output (I/O) pads to engineering change (EC) pads on the top surface of the multi-layer structure. As shown in Chance et al. U.S. Pat. No. 4,489,364, the disclosure of which is incorporated by reference herein, an electronic circuit module in which connections to pads to which chips are connected are buried within the body of the multi-layer structure but are periodically brought to the surface of the module and linked by EC pads of a so-called "dog-bone" shape. Continuity of these connections may be broken by severing the narrow portion of the dog bone. The EC or repair is made by wiring from EC pad to EC pad using a so-called "yellow wire" (which bypasses the severed dog bone) and by redistribution wiring formed in the multi-layer structure from EC pad to chip I/O pad.

Ho U.S. Pat. No. 4,254,445, the disclosure of which is incorporated by reference herein, discloses an alternative wiring scheme wherein engineering change interconnection lines are placed parallel to chip sites and terminate at pads adjacent to the chip site. Fly wires are used to connect the desired engineering change interconnection lines at crossover points or to connect an engineering change interconnection line to an EC pad at a chip site.

More recently, Bhatia et al. U.S. Pat. No. 5,243,140, the disclosure of which is incorporated by reference herein, discloses an engineering change wiring scheme wherein wiring changes at the chip site may be made using surface wiring but changes between chip sites must still be made using buried EC wires and their accompanying EC pads.

Weigler et al. U.S. Pat. Nos. 5,220,490 and 5,224,022 disclose subsurface wiring channels which are interspersed among the chip sites. Wiring changes may be made through the use of "spot links" on the surface of the substrate.

What all the above prior art solutions have in common is the need for buried wiring and EC pads to accomplish their EC and repair functions. It would be desirable to be able to accomplish ECs and wiring repairs without the need for buried wiring and EC pads.

Thus, it is a purpose of the present invention to have a wiring scheme to accomplish ECs and wiring repairs without the necessity of having buried EC wiring and EC pads.

It is another purpose of the present invention to have a wiring scheme that is substantially on the surface of the substrate.

It is yet another purpose of the present invention to have a wiring scheme that is flexible in nature so as to easily allow ECs and wiring repairs.

These and other purposes of the present invention will become more apparent after referring to the following description of the invention in conjunction with the accompanying drawings.

BRIEF SUMMARY OF THE INVENTION

One aspect of the invention relates to a thin film layer wiring scheme on a substrate comprising:
- at least two chip connection pads at a first chip site on the thin film layer:
- a first directional wiring line interspersed between the first chip site chip connection pads;
- at least one wiring interconnection line connecting one first chip site chip connection pad with the first directional wiring line at the first chip site;
- at least two chip connection pads at a second chip site on the thin film layer;
- a first directional wiring line interspersed between the second chip site chip connection pads; and
- at least one chip site interconnection line connecting the first directional wiring line at the first chip site with the first directional wiring line at the second chip site.

A second aspect of the invention relates to a thin film layer wiring scheme on a substrate comprising:
- a plurality of chip connection pads at a first chip site on the thin film layer;
- a plurality of directional wiring lines interspersed between the first chip site chip connection pads, at least one of the directional wiring lines being orthogonal to at least one of the other directional wiring lines;
- at least one wiring interconnection line connecting one first chip site chip connection pad with one of the directional wiring lines at the first chip site;
- a plurality of chip connection pads at a second chip site on the thin film layer;
- a plurality of directional wiring lines interspersed between the second chip site chip connection pads, at least one of the directional wiring lines being orthogonal to at least one of the other directional wiring lines;
- at least one wiring interconnection line connecting one second chip site chip connection pad with one of the directional wiring lines at the second chip site; and
- a plurality of chip site interconnection lines connecting at least one of the directional wiring lines at the first chip site with at least one of the directional wiring lines at the second chip site.

A third aspect of the invention relates to a method of modifying a thin film layer wiring scheme on a substrate comprising a plurality of chip connection pads at each of a first chip site on the substrate and a second chip site on the substrate, a plurality of directional wiring lines interspersed between the chip connection pads at each of the first and second chip sites, at least one of the directional wiring lines being orthogonal to at least one of the other directional wiring lines at each of the first and second chip sites, and a plurality of chip site interconnection lines, the method comprising the steps of:

depositing metallization so as to form a wiring interconnection line connecting one chip connection pad at the first chip site to a directional wiring line at the first chip site;

deleting a portion of at least one of the directional wiring lines at the first chip site;

depositing metallization so as to form a wiring interconnection line connecting one chip connection pad at the second chip site to a directional wiring line at the second chip site;

deleting a portion of at least one of the directional wiring lines at the second chip site; and connecting the directional wiring line at the first chip site to the directional wiring line at the second chip site by a chip site interconnection line.

BRIEF DESCRIPTION OF THE DRAWINGS

FIGS. 4 and 5 together show a surface wiring change or repair accomplished between two chip sites.

DETAILED DESCRIPTION OF THE INVENTION

Figure 1:
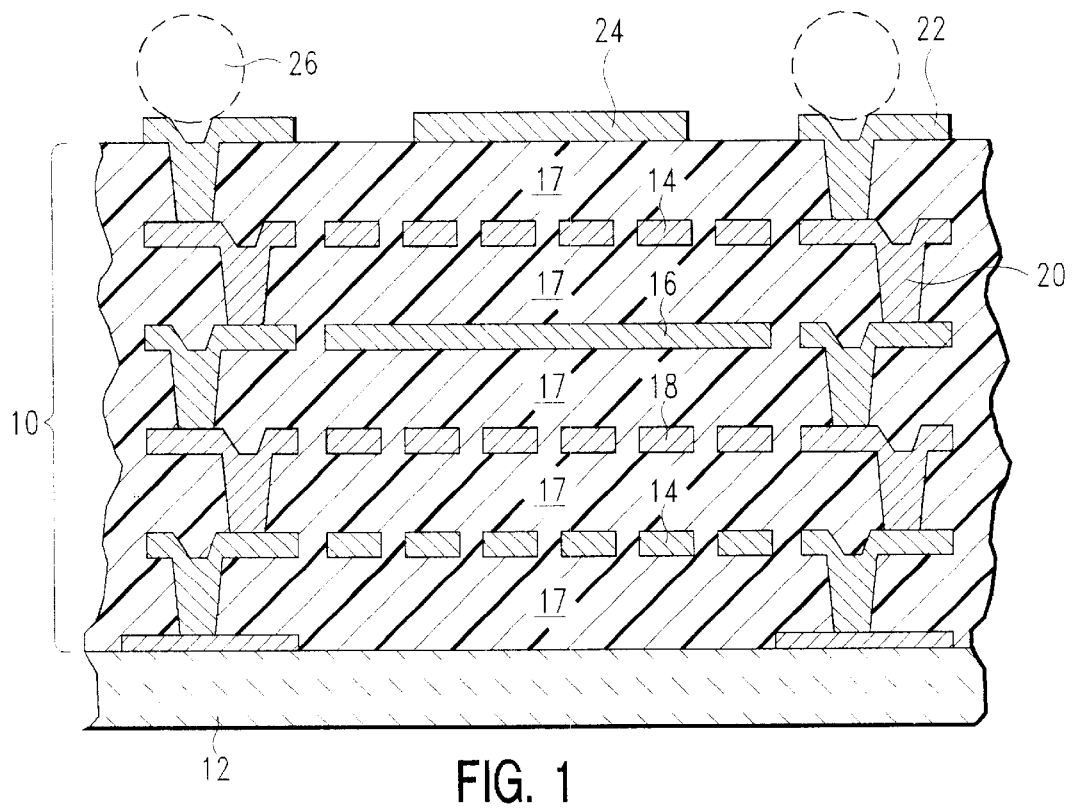
FIG. 1 is a schematical crosssection of a thin film layer showing a portion of the thin film wiring scheme according to the present invention on the top surface of the thin film layer.

Referring to the Figures in more detail, and particularly referring to FIG. 1, there is shown a thin film layer, generally denoted as 10, on a substrate 12, which is typically a ceramic material such as alumina, a glass-ceramic, aluminum nitride or like material. The thin film layer 10 is usually made up of several metallization sublayers comprising, for example, one or more power planes 14, Y wiring lines 16, X wiring lines 18, vias 20 and chip contact pads 22. It should be understood that the precise number of thin film sublayers is not important to the present invention. The metallalization of the sublayers may be, for example, copper or any other suitable metal or alloy. Between the sublayers of metallization is dielectric 17, which may be, for example, polyimide, photosensitive polyimide, fluorinated thermoplastic etc.

Thin film layers are generally quite well known in the art. Situated on the top surface of thin film layer 10 is the thin film layer wiring scheme, a portion of which is denoted as 24. Shown in phantom are solder balls 26 from a semiconductor device (not shown) which make contact with chip contact pads 22 in an arrangement called a controlled collapse chip connection (also known as C4) which is well known in the art. The top surface of thin film layer 10 may also be suitably modified for wire bonding, tape automated bonding (TAB), etc. in place of C4 connections, as is well known to those skilled in the art.

Figure 2:
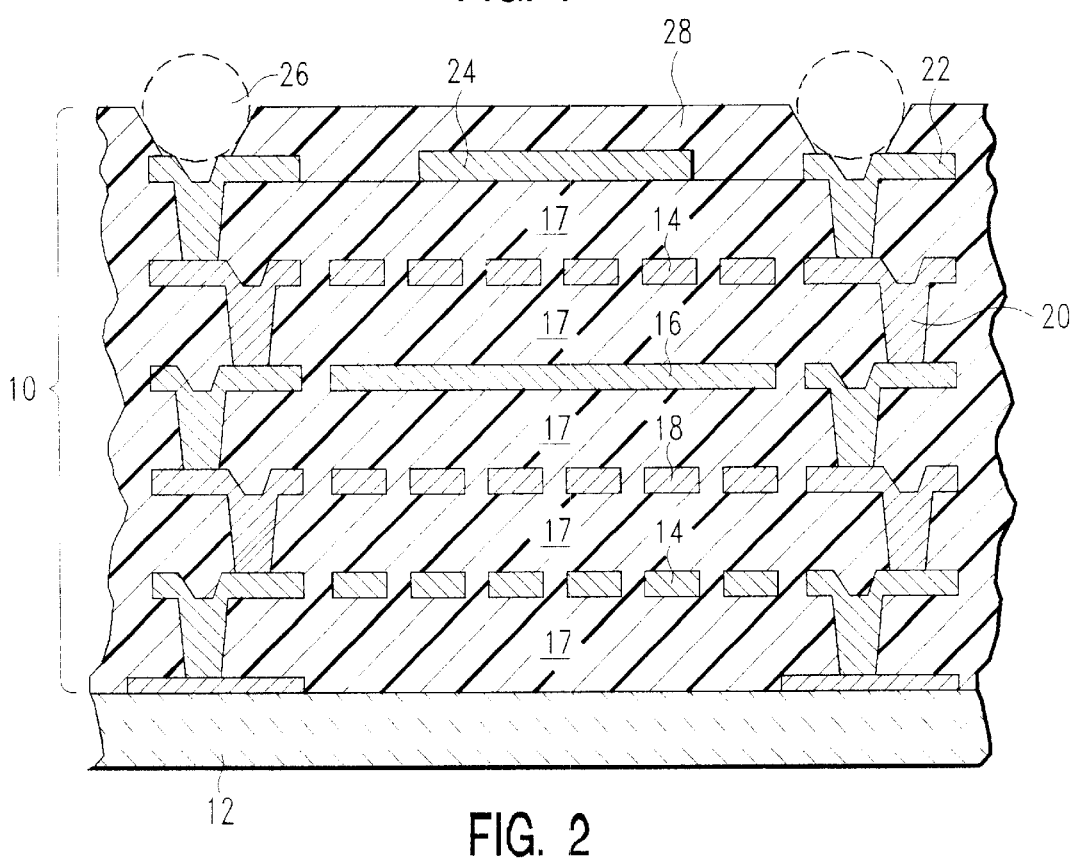
FIG. 2 is a schematical crossection of the thin film layer of FIG. 1 and also including a protective layer of insulating material.

The thin film wiring scheme may also comprise a protective layer of material 28, as shown in FIG. 2, which covers the top most portions of the thin film layer wiring scheme so as to protect these features from handling and environmental damage. More will be said later of this protective layer of material 28.

Figure 3:
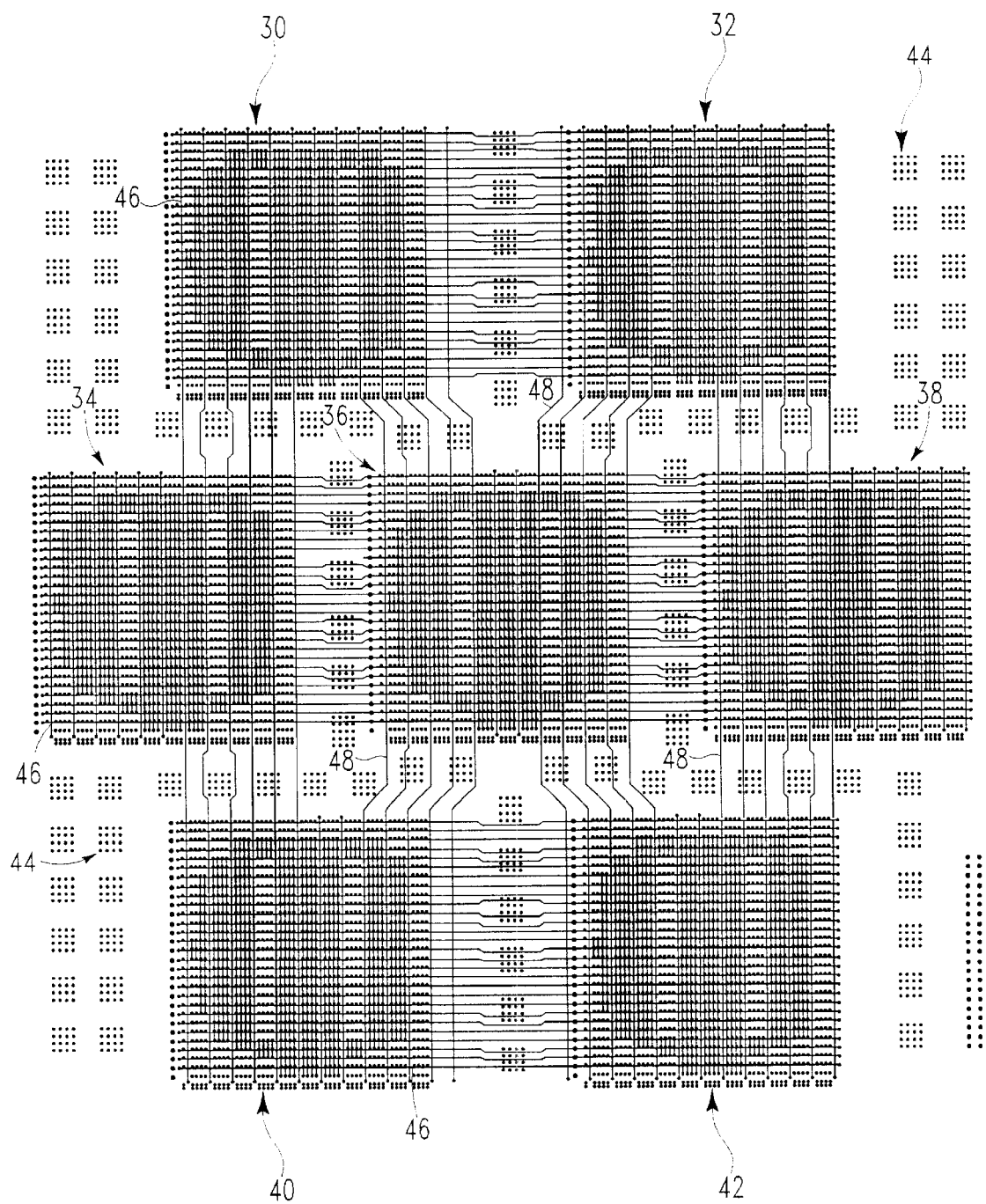
FIG. 3 is a plan view of the thin film layer wiring scheme according to the present invention on a multi-chip site substrate.
Figure 4:
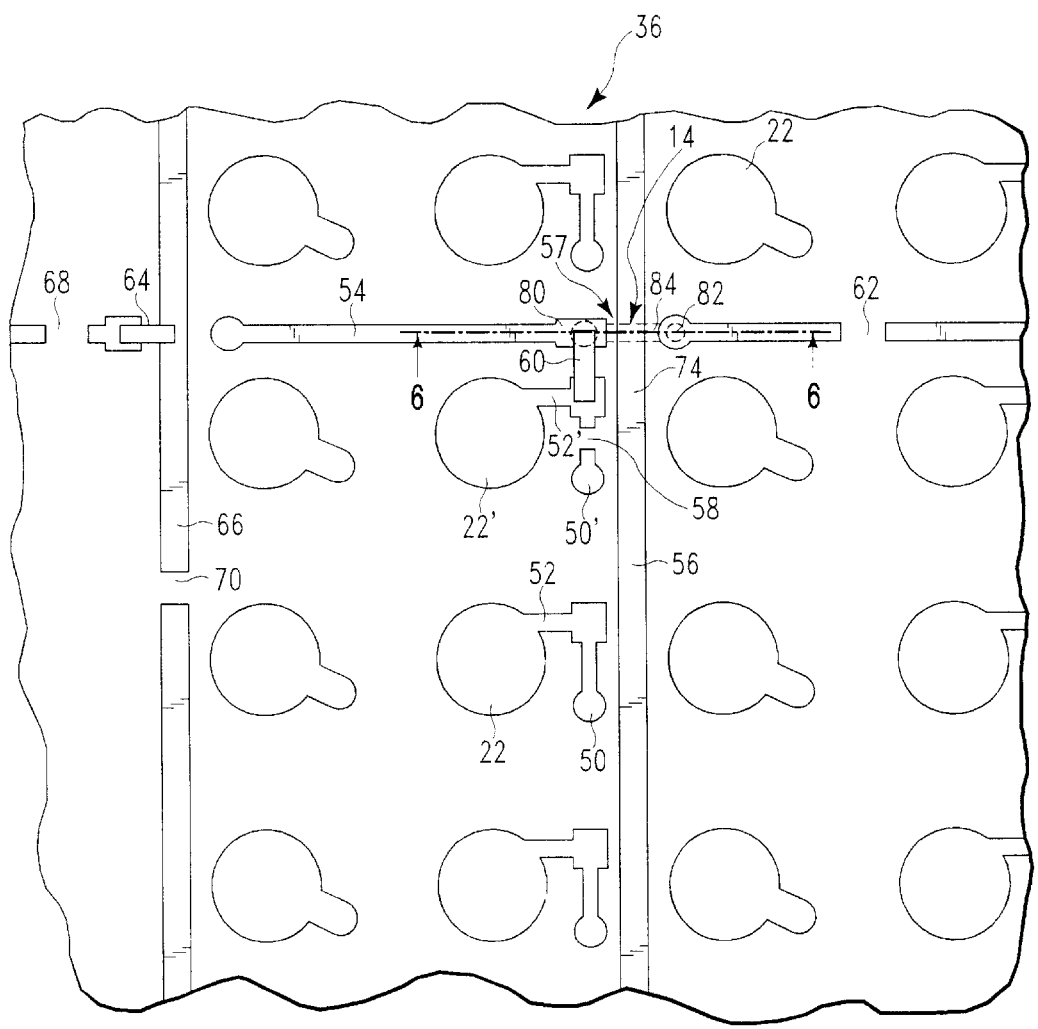
FIG. 4 is an enlargement of a portion of one of the chip sites of FIG. 3 showing a connection to an X directional wiring line.
Figure 5:
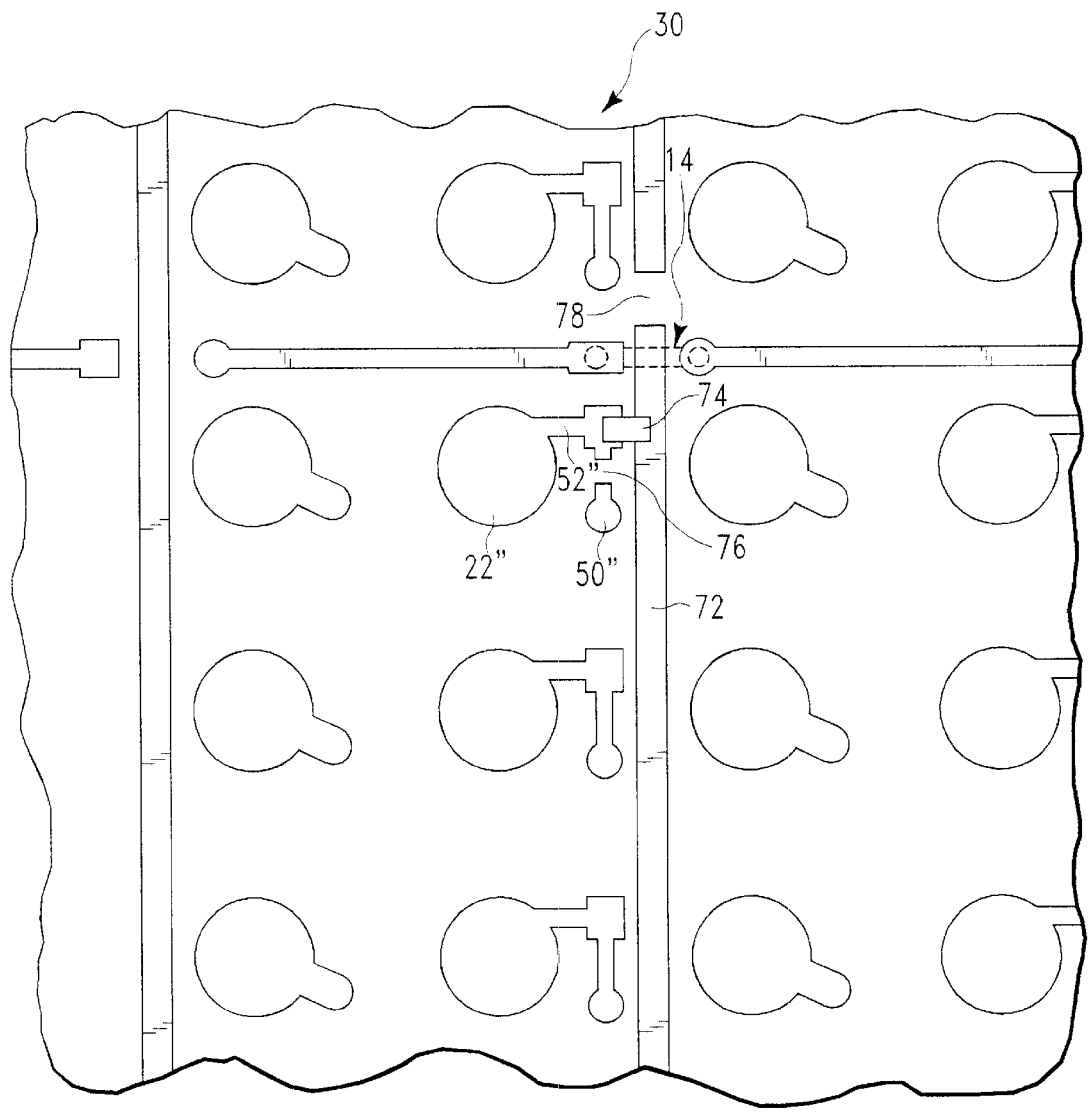
FIG. 5 is an enlargement of a portion of a second one of the chip sites of FIG. 3 showing a connection to a Y directional wiring line.

Reference should now be made to FIGS. 3 to 5. As shown in FIG. 3, the thin film layer 10 has a plurality of sites 30, 32, 34, 36, 38, 40, and 42 situated thereon for receiving semiconductor devices (not shown), hereafter chip sites. Adjacent to the chip sites are additional sites 44 for receiving other devices such as capacitors (not shown). Additional sites 44 are optional and are not necessary for the present invention. Each chip site has a plurality of directional wiring lines 46 interspersed between the chip connection pads 22 of the chip site. There are also present a plurality of chip site interconnection lines 48 which traverse from chip site to chip site and thus serve to connect directional wiring lines 46 from different chip sites.

FIGS. 4 and 5 are enlarged views of the chip sites 36 and 30, respectively. Chip connection pads 22 are connected to LST (logic service terminal) signal pad 50 via metallization 52. There will be at least one directional wiring line 54 interspersed between the chip connection pads 22. In practice, however, there will usually be a plurality of such directional wiring lines, another one of which is shown as directional wiring line 56. If need be, the directional wiring lines may be interspersed between every row of chip connection pads but it is more likely that the directional wiring lines will be interspersed such that there will be several rows of chip connection pads between each directional wiring line. As will be explained in more detail hereafter, directional wiring lines 54, 56 overlap at 57 but are not in electrical contact with each other. In a preferred embodiment of the invention, the directional wiring lines 54, 56 are orthogonal to each other. In an arrangement such as that shown in FIG. 4, directional wiring line 54 may be called an X wiring line (because it extends in the "X" direction) while directional wiring line 56 may be called a Y wiring line (because it extends in the "Y" direction). With the directional wiring lines proceeding in the X and Y directions, all parts of the chip site and surrounding chip sites can be serviced. It is also possible for some of the directional wiring lines to extend diagonally across the chip sites along with some of the other lines extending in the X and Y directions. In this case, some of the directional wiring lines will not be orthogonal to each other. Since the directional wiring lines preferably extend across the entire chip site (although individual directional wiring lines need not necessarily do so), it is apparent that the directional wiring lines will cross at intersection points. In the present invention, the directional wiring lines overlap, but do not electrically contact, each other by an arrangement which will be discussed hereafter.

Not shown in FIGS. 4 and 5 are the chip site interconnection lines 48. However, it should be understood that some of the directional wiring lines 46 at each chip site end at the chip site while others of the directional wiring lines 46 continue and join with the chip site interconnection lines 48 so that wiring changes and repairs can be made easily across chip sites.

Referring to FIGS. 4 and 5, it is assumed that the subsurface wiring net connecting chip connection pad 22' and LST signal pad 50' at chip site 36 to chip connection pad 22" and LST signal pad 50" at chip site 30 is faulty and in need of repair. It would be desirable to reroute the wiring from chip connection pad 22' to chip connection pad 22". Such rerouting would be impossible in the normal thin film layer (because the wiring from chip connection pad 22' to chip connection pad 22" is subsurface) unless there is provision made for changes such as with EC pads and buried EC wiring nets which consume valuable wiring. The wiring change/repair, according to the present invention however, may be easily made in the following manner as illustrated in FIG. 4. First, metallization 52' is deleted at 58 so that pad 22' is isolated from LST signal pad 50'. Metallization 60 is deposited so as to form a wiring interconnection line between chip connection pad 22' and directional wiring line 54. Further metallization 64 is deposited to connect directional wiring line 54 with orthogonal directional wiring line 66. Directional wiring line 54 is then deleted at 62 and 68 so as to isolate that part of directional wiring line 54 that is necessary for the new wiring net. Similarly, directional wiring line 66 is deleted at 70. At this point, directional wiring line 66 would connect, either directly or through connections with other directional wiring lines 46, with a chip site interconnection line 48 for carrying the signal to chip site 30.

It should be noted that testing of the subsurface wiring net may be accomplished on a previous wiring level. If this is the case, then faults in the subsurface wiring net, or changes in the wiring scheme, will be known prior to deposition of the top level wiring. Then all of the top level wiring, including directional wiring lines, etc., can be deposited at the same time by suitable deposition techniques. Appropriate wiring deletions can then be accomplished to finish the wiring scheme.

Chip site interconnection line 48 would then connect, directly or indirectly, to directional wiring line 72 at chip site 30. As shown in FIG. 5, metallization would be deposited to form a wiring interconnecting line 74 connecting directional wiring line 72 with metallization 52". Lastly, metallization 52" would be deleted at 76 and directional wiring line 72 would be deleted at 78. The new wiring net is now complete.

The deletion of the appropriate parts of the wiring nets may be accomplished by abrasion, etching or by laser ablation. Where metallization is to be accomplished, techniques such as laser sonic bonding, laser chemical vapor deposition or staple bonding have been found to be effective. The above-mentioned Bhatia et al. reference, for example, discloses such deletion and metal deposition techniques.

An important feature of the present invention is that all of the chip connection pads, directional wiring lines, wiring interconnection lines, and chip site interconnection lines are on the top surface of the thin film layer and thus are readily accessible for wiring changes and repairs.

In a preferred embodiment of the invention, a protective layer 28 of electrically insulating material is deposited over the top surface of the thin film layer 10, as shown in FIG. 2. This protective layer protects the surface metallization from handling and environmental damage. The protective layer is preferably deposited after all of the wiring changes and repairs have been made. Alternatively, the protective layer may be first deposited and then where metallization deletions or additions are to be made, the protective layer may be ablated (such as with a laser) so as to expose the metallization. The metallization deletions or additions may then be accomplished, followed by spot deposition of the protective layer to provide protection for the wiring changes and repairs which were just made.

The material of the protective layer should be compatible with the dielectric of the underlying thin film layer. A variety of dielectric polymeric materials may be chosen for the protective layer and the underlying thin film layer. Particularly preferred polymeric materials are the polymides but other high temperature polymers having thermal stability, adhesion, dielectric constant and solvent resistance properties similar to polyimides are also suitable for purposes of the present invention. Other suitable materials for example include liquid crystal polyesters, fluorinated thermoplastics and epoxies as well as photosensitive materials such as the photosensitive polyimides and epoxies.

As mentioned earlier, the directional wiring lines overlap but do not electrically contact each other, as shown for example by directional wiring lines 54, 56 in FIG. 4. This arrangement can be effected by allowing one of the directional wiring lines to "jog" underneath the other of the directional wiring lines when they would otherwise directly intersect and contact each other. Referring to FIG. 4, directional wiring line 54 would temporarily terminate its surface route at pad 80 wherein it would traverse down to a sublayer of the thin film layer 10 by a via (hidden by pad 80). The exact sublayer that directional wiring line 54 traverses down to is unimportant although the shortest traverse is preferred. As shown in FIG. 1, the shortest traverse down would be to the upper power plane 14. From there, directional wiring line 54 would traverse underneath directional wiring line 56 while on power plane 14, as indicated by dotted line segment 84 in FIG. 4. Then, directional wiring line 54 would traverse upwardly to pad 82 by a via (hidden by pad 82), wherein it would then continue its surface route.

Figure 6:
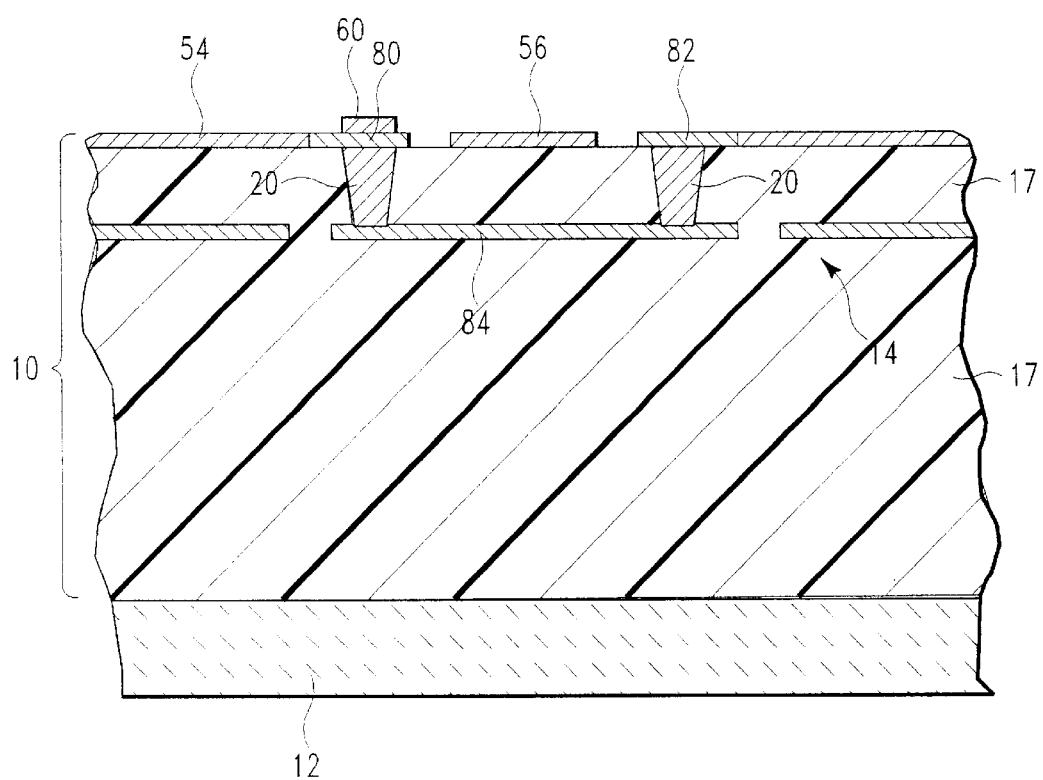
FIG. 6 is a schematical crossection view taken from FIG. 4 in the direction of arrows VI—VI and shows a jog according to the present invention.

Refering now to FIG. 6, a partial schematical crossection view is depicted of the jog. This is a view in the direction of arrows VI—VI as found in FIG. 4. Directional wiring line 54 jogs beneath directional wiring line 56. Directional wiring line 54 temporarily terminates its surface route at pad 80 wherein it traverses through dielectric 17 down to sublayer 14 of the thin film layer 10 by a via 20. From there it traverses under directional wiring line 56 by way of segment 84 of power plane 14. Then, the directional wiring line 54 traverses upwardly to pad 82 by another via 20, wherein it continues its surface route.

As can be seen then, except for the jogs of the directional wiring lines where they would normally intersect, all of the wiring changes and repairs can be easily accomplished on the surface of the thin film layer, thereby making the buried wiring nets normally used for this purpose unnecessary.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A thin film layer wiring scheme on a substrate comprising:
    at least two chip connection pads with an inter pad space at a first chip site on a thin film layer:

a first chip site first directional wiring line interspersed between the first chip site chip connection pads;

at least one wiring interconnection line connecting one of the first chip site chip connection pads with the first chip site first directional wiring line at the first chip site;

at least a first chip site second directional wiring line interspersed between the chip connection pads at the first chip site, wherein the first chip site first directional wiring lines and first chip site second directional wiring line are overlapping but not electrically contacting at the first chip site;

at least two chip connection pads with another inter pad space at a second chip site on the thin film layer, wherein the at least two chip connection pads at the first chip site are separated from the at least two chip connection pads at the second chip site by a space which is greater than any of said inter pad spaces;

a second chip site first directional wiring line interspersed between the second chip site chip connection pads; and at least one chip site interconnection line connecting the first chip site first directional wiring line at the first chip site with the second chip site first directional wiring line at the second chip site, wherein the chip connection pads at a first chip site, the chip connection pads at a second chip site, first and second chip site first directional wiring lines, at least one wiring interconnection line and at least one chip site interconnection line all being located on a single sublayer of the thin film layer.

2. The wiring scheme of claim 1 wherein one of the first chip site first directional wiring lines at the first chip site is an X wiring line and one of the first chip site second directional wiring lines at the first chip site is a Y wiring line.

3. The wiring scheme of claim 1 wherein at least a portion of one of the first chip site second directional wiring line at the first chip site has been removed.

4. The wiring scheme of claim 1 wherein the overlapping first chip site second directional wiring line at the first chip site jogs underneath the first chip site first directional wiring lines, such jog comprising a traverse down to a subsurface portion of the thin film layer through a via, a traverse across the subsurface portion and underneath the other of the overlapping directional wiring lines and a traverse up to the one of the overlapping directional wiring lines through another via.

5. A thin film layer wiring scheme on a substrate comprising:

at least two chip connection pads with an inter pad space at a first chip site on a thin film layer:

a first chip site first directional wiring line interspersed between the first chip site chip connection pads;

at least one wiring interconnection line connecting one of the first chip site chip connection pads with the first chip site first directional wiring line at the first chip site;

at least two chip connection pads with another inter pad space at a second chip site on the thin film layer, wherein the at least two chip connection pads at the first chip site are separated from the at least two chip connection pads at the second chip site by a space which is greater than any of said inter pad spaces;

a second chip site first directional wiring line interspersed between the second chip site chip connection pads;

wherein there is at least a second chip site second directional wiring line interspersed between the chip connection pads at the second chip site, the second chip site first directional wiring line and second chip site second directional wiring line overlapping but not contacting at the second chip site; and at least one chip site interconnection line connecting the first chip site first directional wiring line at the first chip site with the second chip site first directional wiring line at the second chip site, wherein the chip connection pads at a first chip site, the chip connection pads at a second chip site, first and second chip site first directional wiring lines, at least one wiring interconnection line and at least one chip site interconnection line all being located on a single sublayer of the thin film layer.

6. The wiring scheme of claim 1 or 5 wherein the chip connection pads at a first chip site, the chip connection pads at a second chip site, first and second chip site first directional wiring lines, at least one wiring interconnection line and at least one chip site interconnection line all being located on the top surface of the thin film layer.

7. The wiring scheme of claim 4 or 5 wherein the chip connection pads at a first chip site, the chip connection pads at a second chip site, first and second chip site first directional wiring lines, at least one wiring interconnection line and at least one chip site interconnection line are covered with a protective layer of electrically insulating material.

8. The wiring scheme of claim 1 or 5 wherein at least a portion of the first chip site first directional wiring line at the first chip site has been removed.

9. The wiring scheme of claim 1 or 5 further comprising at least one wiring interconnection line at the second chip site connecting one second chip site chip connection pad with the second chip site first directional wiring line at the second chip site.

10. The wiring scheme of claim 5 wherein one of the second chip site first directional wiring lines at the second chip site is an X wiring line and one of the second chip site second directional wiring lines at the second chip site is a Y wiring line.

11. The wiring scheme of claim 1 or 5 wherein at least a portion of the second chip site first directional wiring line at the second chip site has been removed.

12. The wiring scheme of claim 5 wherein at least a portion of one of the second chip site second directional wiring lines at the second chip site has been removed.

13. The wiring scheme of claim 5 wherein the overlapping second chip site second directional wiring lines at the second chip site jogs underneath the second chip site first directional wiring lines, such jog comprising a traverse down to a subsurface portion of the thin film layer through a via, a traverse across the subsurface portion and underneath the other of the overlapping directional wiring lines and a traverse up to the one of the overlapping directional wiring lines through another via.

14. A thin film wiring scheme on a substrate comprising:

a plurality of chip connection pads at a first chip site with an inter pad spacing on a thin film layer;

a plurality of directional wiring lines interspersed between the first chip site chip connection pads, at least one of the first chip site directional wiring lines being orthogonal to at least another one of the first chip site directional wiring lines,wherein the orthogonal directional wiring lines at the first chip site overlap but do not contact each other;

at least one wiring interconnection line connecting one of the first chip site chip connection pads with one of the directional wiring lines at the first chip site;

a plurality of chip connection pads at a second chip site with another inter pad spacing on the thin film layer, where the first chip site being separated from the second chip site by a space which is greater than any of said inter pad spaces;

a plurality of directional wiring lines interspersed between the second chip site chip connection pads, at least one of the second chip site directional wiring lines being orthogonal to at least another one of the second chip site directional wiring lines;

at least one wiring interconnection line connecting one of the second chip site chip connection pads with one of the directional wiring lines at the second chip site; and a plurality of chip site interconnection lines connecting at least one of the directional wiring lines at the first chip site with at least one of the directional wiring lines at the second chip site, wherein the chip connection pads, directional wiring lines, wiring interconnection lines and chip site interconnection lines all being located on a single sublayer of the thin film layer.

15. The wiring scheme of claim 14 wherein one of the orthogonal directional wiring lines at the first chip site jogs underneath the other of the orthogonal directional wiring lines, such jog comprising a traverse down to a subsurface portion of the thin film layer through a via, a traverse across the subsurface portion and underneath the other of the orthogonal directional wiring lines and a traverse up to the one of the orthogonal directional wiring lines through a via.

16. A thin film wiring scheme on a substrate comprising:

a plurality of chip connection pads at a first chip site with an inter pad spacing on a thin film layer;

a plurality of directional wiring lines interspersed between the first chip site chip connection pads, at least one of the first chip site directional wiring lines being orthogonal to at least another one of the first chip site directional wiring lines;

at least one wiring interconnection line connecting one of the first chip site chip connection pads with one of the directional wiring lines at the first chip site;

a plurality of chip connection pads at a second chip site with another inter pad spacing on the thin film layer, where the first chip site being separated from the second chip site by a space which is greater than any of said inter pad spaces;

a plurality of directional wiring lines interspersed between the second chip site chip connection pads, at least one of the second chip site directional wiring lines being orthogonal to at least another one of the second chip site directional wiring lines, wherein the orthogonal directional wiring lines at the second chip site overlap but do not contact each other;

at least one wiring interconnection line connecting one of the second chip site chip connection pads with one of the directional wiring lines at the second chip site; and a plurality of chip site interconnection lines connecting at least one of the directional wiring lines at the first chip site with at least one of the directional wiring lines at the second chip site, wherein the chip connection pads, directional wiring lines, wiring interconnection lines and chip site interconnection lines all being located on a single sublayer of the thin film layer.

17. The wiring scheme of claim 14 or 16 wherein all of the chip connection pads, directional wiring lines, wiring interconnection lines and chip site interconnection lines are on the top surface of the thin film layer.

18. The wiring scheme of claim 14 or 16 wherein all of the chip connection pads, directional wiring lines, wiring interconnection lines and chip site interconnection lines are covered with a protective layer of electrically insulating material.

19. The wiring scheme of claim 14 or 16 wherein at least a portion of one of the directional wiring lines at the first chip site has been removed.

20. The wiring scheme of claim 16 wherein one of the orthogonal directional wiring lines at the second chip site jogs underneath the other of the orthogonal directional wiring lines, such jog comprising a traverse down to a subsurface portion of the thin film layer through a via, a traverse across the subsurface portion and underneath the other of the orthogonal directional wiring lines and a traverse up to the one of the orthogonal directional wiring lines through a via.

21. The wiring scheme of claim 14 or 16 wherein at least a portion of one of the directional wiring lines at the second chip site has been removed.

* * * * *